United States Patent [19]
Suzuki et al.

[11] Patent Number: 5,761,149
[45] Date of Patent: Jun. 2, 1998

[54] DYNAMIC RAM

[75] Inventors: Yukihide Suzuki, Akishima; Kanehide Kenmizaki, Kodaira; Tsugio Takahashi, Hamura; Masayuki Nakamura, Ome; Makoto Saeki; Chisa Makimura, both of Hamura; Katsuo Komatsuzaki, Ibaraki-ken; Shunichi Sukegawa, Tsukuba, all of Japan

[73] Assignees: Hitachi, Ltd., Tokyo, Japan; Texas Instruments Inc., Dallas, Tex.

[21] Appl. No.: 679,724

[22] Filed: Jul. 12, 1996

[30] Foreign Application Priority Data

Jul. 14, 1995 [JP] Japan .................................. 7-201674

[51] Int. Cl.⁶ .................................................. G11C 8/00
[52] U.S. Cl. .............................. 365/230.03; 365/230.06; 365/63
[58] Field of Search ...................... 365/230.03, 230.06, 365/63, 149, 189.01, 72

[56] References Cited

U.S. PATENT DOCUMENTS

| | | | |
|---|---|---|---|
| 4,958,326 | 9/1990 | Sakurai | 365/230.03 |
| 5,140,550 | 8/1992 | Miyaoka et al. | 365/289.01 |
| 5,193,074 | 3/1993 | Anami | 365/230.03 |
| 5,506,816 | 4/1996 | Hirose et al. | 365/230.03 |

FOREIGN PATENT DOCUMENTS

| | | |
|---|---|---|
| A-61-20293 | 1/1986 | Japan . |
| A-63-113888 | 5/1988 | Japan . |
| A-2-158995 | 6/1990 | Japan . |

*Primary Examiner*—Tan T. Nguyen
*Attorney, Agent, or Firm*—Antonelli, Terry, Stout, & Kraus, LLP

[57] ABSTRACT

A dynamic RAM is provided with a main word lines; a plurality of subsidiary word lines which are arranged in the direction of bit lines crossing the main word line and to which a plurality of dynamic memory cells are connected; a plurality of subsidiary word selection lines which are extended so as to perpendicularly intersect the main word line and through which a selection signal for selecting one of the plurality of subsidiary word lines is transmitted; and a logic circuit for receiving a selection signal from the main word line and a selection signal from each of the subsidiary word selection lines to thereby form a selection signal for selecting one of the subsidiary word lines. In the dynamic RAM, the voltage level of each of the main word line and the subsidiary word selection lines is made to be equal to the ground potential when the line is in a not-selected state.

22 Claims, 11 Drawing Sheets

DYNAMIC RAM

CROSS-REFERENCE TO RELATED APPLICATIONS

The present application is relevant to U.S. patent application Ser. No. 08/701,348 filed by Chisa Makimura, Yikihide Suzuki, Shunichi Sukegawa, Hiroyuki Fujiwara and Masayuki Hira, assigned to the present assignee, based on Japanese Patent Application No. 7-237664 filed on Aug. 23, 1995. The contents of that application are incorporated herein by reference.

BACKGROUND OF THE INVENTION

The present invention relates to a dynamic RAM, and particularly to a technique effectively used to repair defects in a split word line system having a main word line and subsidiary word lines.

There has been proposed a split word line system in which a plurality of subsidiary word lines connected with memory cells are provided with respect to a main word line so that only one necessary block is operated in which a selected one of the memory cells is provided. This reduces the operating memory area as much as possible so as to reduce electric power consumption and attain a high-speed operation of selecting one from the subsidiary word lines. An example of such a split word line system is disclosed in JP-A-2-158995. According to JP-A-2158995, the main word line is referred to as a foreset word line and the subsidiary word line is referred to as a word line. Other conventional examples of such a split word line system are disclosed in JP-A-61-20293 and JP-A-63-113888.

SUMMARY OF THE INVENTION

An object of the present invention is to provide a dynamic random access memory (DRAM) in which yield can be improved by a simple configuration.

The conventional split word line system is devotedly aimed both at low electric power consumption and at high-speed operation. Furthermore, the conventional split word line system is designed to relax the pitch of wiring on memory arrays to thereby enlarge the processing margin of the same wiring layer. A problem arises, however, in that there is no consideration of current leakage produced between a main word line and a subsidiary word line perpendicular to the main word line or between the main word line and another signal line. Specifically, the electric potential of the main word line is different from the electric potential of a subsidiary word selection signal line in the stand-by state of a dynamic RAM, or the like. When, for example, the main word line short-circuits to a subsidiary word selection signal line in the conventional system, defects in the main word line are repaired by a known technique. In the stand-by state of the dynamic RAM, however, current leakage is produced between the main word line and the subsidiary word selection signal line, so that a stand-by state current failure can occur. Such failures causes lowering of yield.

A typical aspect of the present invention disclosed in this specification is as follows. That is, a dynamic RAM comprises: a main word line; a plurality of subsidiary word lines which are arranged in the direction of bit lines crossing the main word line and to which a plurality of dynamic memory cells are connected; a plurality of subsidiary word selection lines which are extended so as to perpendicularly intersect the main word line and through which a selection signal for selecting one of the plurality of subsidiary word lines is transmitted; and a logic circuit for receiving a selection signal from the main word line and a selection signal from each of the subsidiary word selection lines to thereby form a selection signal for selecting one of the subsidiary word lines; wherein a voltage level of each of the main word line and the subsidiary word selection lines is set to be equal to a ground potential when the line is not selected.

By the above-configuration, a leakage current can be prevented from flowing even in the case where a failure occurs in insulation between the main word line and the subsidiary word selection signal lines perpendicular to the main word line. Accordingly, direct-current defects can be repaired. That is, stand-by current can be prevented from flowing.

The aforementioned logic circuit includes: a first CMOS inverter circuit which receives a signal on the main word line and which uses, as its operating voltage, a boosted voltage corresponding to a subsidiary word line selection signal in a memory cell; a second CMOS inverter circuit which uses, as its operating voltage, an output signal of the first CMOS inverter circuit and a selection signal transmitted to the subsidiary word selection line to thereby form a drive signal to be transmitted to the subsidiary word line; and an N-channel type MOSFET provided between the subsidiary word line and the subsidiary word selection line and having its gate connected to the main word line. Accordingly, a subsidiary word line selection signal can be formed so that the subsidiary word line selection signal is turned to a high level when both the respective levels of the main word line and the subsidiary word selection line are high, and that both the respective levels of the main word line and the subsidiary word selection line can be turned to low when the lines are not selected.

The aforementioned logic circuit includes: an N-channel type drive MOSFET which transmits a selection signal on each of the subsidiary word selection lines to each of the subsidiary word lines; an N-channel type cutting MOSFET which is provided between a gate of the drive MOSFET and the main word line and which has its gate supplied with a source voltage stationarily; a CMOS inverter circuit which receives a signal from the main word line and which uses the source voltage as its operating voltage; and an N-channel type switch MOSFET which has its gate supplied with an output signal of the CMOS inverter circuit and which is provided between the subsidiary word line and a ground potential of the logic circuit. Accordingly, a subsidiary word line selection signal can be formed so that the subsidiary word line selection signal is turned to a high level when both the respective levels of the main word line and the subsidiary word selection line are high, that both the respective levels of the main word line and the subsidiary word selection line can be turned to be high when those lines are not selected, and that not only can the area occupied by the subsidiary word drivers be reduced, but also the current supply capacity of the boosted voltage generating circuit can be reduced.

The main word line is constituted by a second metal wiring layer whereas the subsidiary word selection lines are configured by using a third metal wiring layer, the second metal wiring layer and a first metal wiring layer so that the third metal wiring layer is used in the portions where the subsidiary word selection lines and the main word line are crossed to each other and the first metal wiring layer is used in the portions where the subsidiary word selection lines are connected to circuit elements constituting the logic circuit. Accordingly, the influence of a failure in insulation between the wiring lines can be reduced by turning the respective levels of the lines to be low in the aforementioned not-selected state.

In the dynamic RAM in which the main and subsidiary word lines are provided with redundant main and subsidiary word lines for repairing defects, a failure main word line is substantially fixed to a not-selected level. Accordingly, the influence of a failure in insulation between the main word line and the subsidiary word line can be reduced by setting the not-selected level of the subsidiary word selection signal to be low.

DESCRIPTION OF THE PREFERRED EMBODIMENTS

Figure 5:
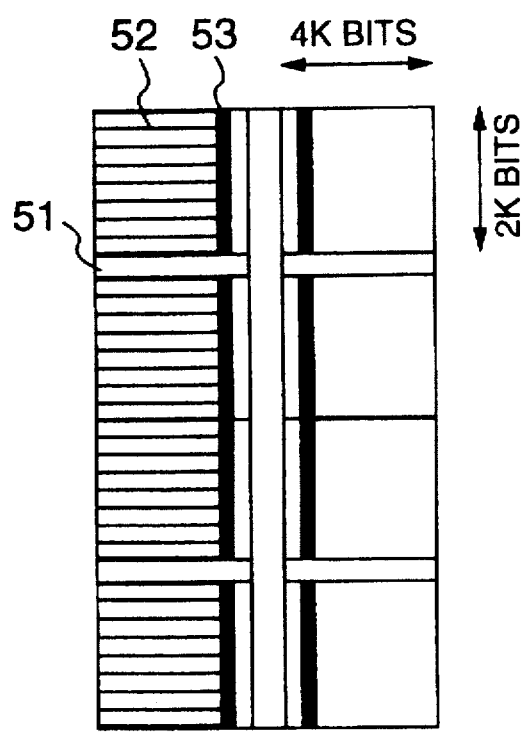
FIG. 5 is a schematic layout view showing an embodiment of the dynamic RAM according to the present invention.

FIG. 5 is a schematic view of the layout of a dynamic RAM according to an embodiment of the present invention. In FIG. 5, of various circuit blocks constituting a dynamic RAM, parts related to the present invention are illustrated so as to be understood. Those parts are formed on a single semiconductor substrate such as a single-crystal silicon substrate by a known semiconductor integrated circuit producing technique.

The dynamic RAM in this embodiment is not limited specifically but, for example, is designed to have a storage capacity of about 64 megabits. The dynamic RAM is split into eight memory arrays as a whole. That is, four memory arrays are provided on each of the opposite sides, that is, in the left and right sides in the drawing, with respect to the longitudinal direction (that is, vertical direction in the drawing) of the semiconductor chip. Though not shown, input/output interface circuits such as an address input circuit, a data input/output circuit, and so on, are provided in the center portion of the semiconductor chip.

The four memory arrays provided in each of the left and right sides with respect to the longitudinal (vertical) direction, in the drawing, of the semiconductor chip as described above are arranged to form two pairs. Every pair of memory arrays arranged as described above are provided with a main word driver 51 disposed in a center portion between the memory arrays of the pair. The main word driver 51 is provided for the pair of memory arrays which are disposed on the upper and lower sides of the main word driver 51. The main word driver 51 forms a signal for selecting a main word line which is extended so as to pass through each memory array. Each memory array is connected a dynamic memory cell which constitutes a storage capacity of 2 Kbits in the direction of the main word line and 4 Kbits in the direction of a not shown complementary bit line (also referred to as data line) perpendicular to the direction of the main word line. Because there are provided eight memory arrays configured as described above as a whole, the resulting dynamic RAM has a large storage capacity of 8×2K×4K=64 Mbits in total.

Every memory array as described above is divided into eight memory blocks in the direction of the main word line. A subsidiary word driver 52 is provided to each of the memory blocks thus split. Each subsidiary word driver 52 is separated so as to be one-eighth as long as the main word line and the subsidiary word driver 52 forms a signal for selecting a subsidiary word line which is extended in parallel with the main word line. Although this embodiment shows the case where four subsidiary word lines are arranged in the direction of the complementary bit line for each main word line in order to reduce the number of main word lines, or, in other words, in order to relax the wiring pitch of main word lines, the number of subsidiary word lines is not limited specifically. In this manner, not only every memory array is divided into eight subsidiary word lines in the direction of the main word line but also every four subsidiary word lines are assigned in the direction of the complementary bit line. To select one of the four subsidiary word lines arranged as described above, there is provided a subsidiary word selection line driver 53. The subsidiary word selection driver 53 forms a selection signal for selecting one of the four subsidiary word lines extended in the direction of the arrangement of the subsidiary word drivers 52.

With respect to one memory array as described above, one subsidiary word selection line is selected in a subsidiary word driver corresponding to one memory block containing a memory cell to be selected from eight memory blocks allocated to one main word line. As a result, one subsidiary word line is selected from 8×4=32 subsidiary word lines which belong to one main word line. Because 2K (2048) memory cells are provided in the direction of the main word line as described above, 2048/8=256 memory cells are connected to one subsidiary word line. Although this embodiment shows the case where eight subsidiary word lines for each main word line are selected by a refreshing operation (for example, in a self-refresh mode), the operation is not limited to this specifically.

Figure 6:
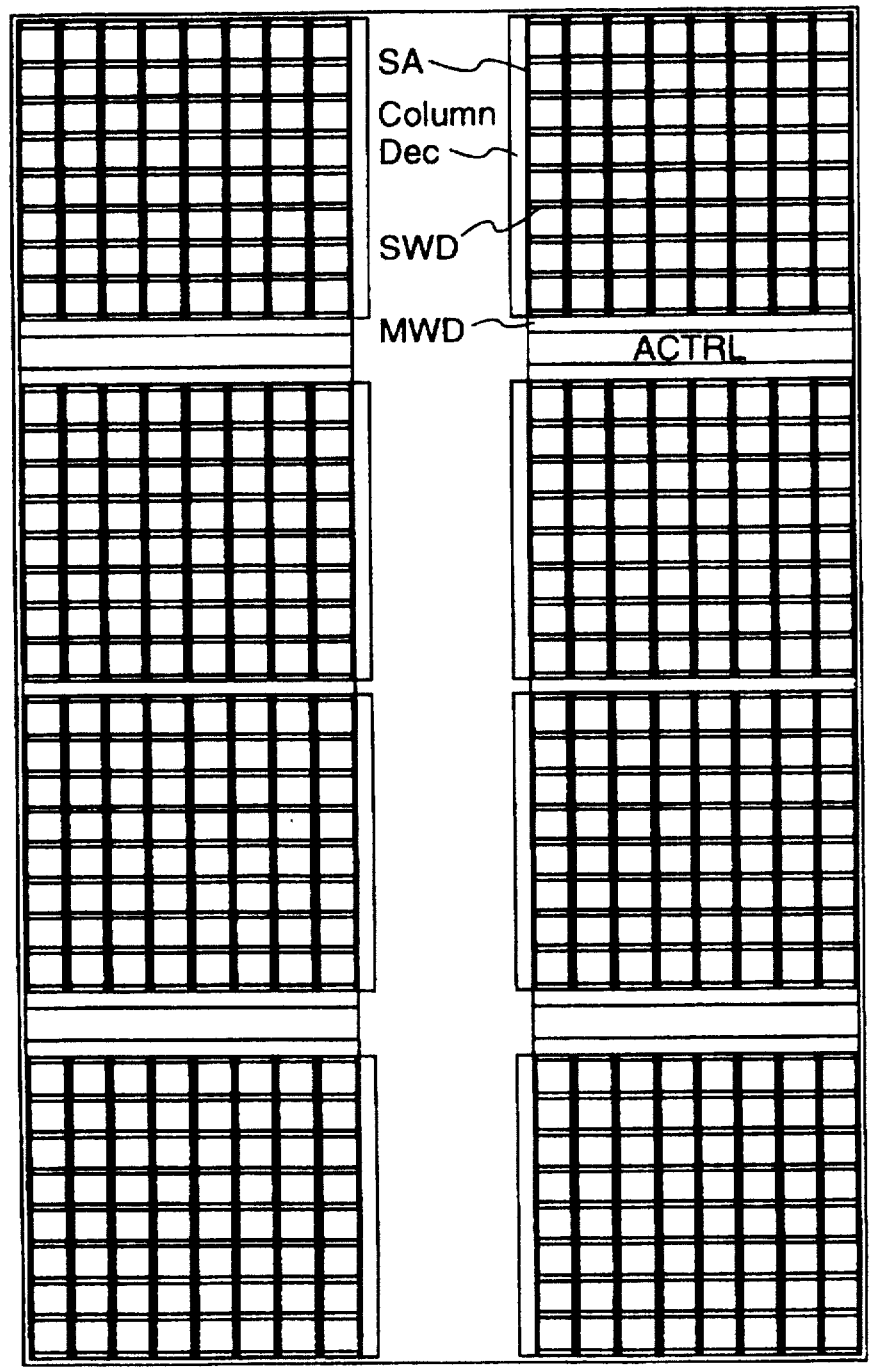
FIG. 6 is a layout view showing an embodiment of the dynamic RAM depicted in FIG. 5.

FIG. 6 is a view showing a layout of an embodiment of an embodiment of the aforementioned dynamic RAM. In FIG. 6, the arrangement of sense amplifier (SA) and column decoder (Column Dec) which are important circuit blocks of a so-called column system is shown to facilitate understanding the dynamic RAM according to the present invention. In FIG. 6, MWD is the aforementioned main word driver, SWD is the aforementioned subsidiary word driver, SA is a sense amplifier, and Column Dec is a column decoder. Further, ACTRL disposed between two memory arrays is an array control circuit for supplying an address decoder and so on with timing signals necessary for operation.

As described above, each memory array has a storage capacity of 4 Kbits in the direction of the complementary bit line. If a memory cell having a memory capacity of 4 Kbits is connected to one complementary bit line, however, the parasitic capacity of the complementary bit line increases so that a signal level read out on the basis of the capacity rate thereof to a fine information storage capacitor cannot be obtained. Therefore, the memory array is divided into eight parts also in the direction of the complementary bit line. That is, every complementary bit line is divided into eight parts by the sense amplifier SA which is indicated by the thick solid line in FIG. 6. Although there is no specific limitation, the sense amplifier SA, as will be described later in detail, is constituted by a shared sense system in which two complementary bit lines are provided in left and right symmetrically in the drawing with respect to every sense amplifier except the sense amplifier disposed at each of the opposite ends of the memory array so that every sense amplifier is selectively connected to either one of the left and right complementary bit lines in the drawing.

Figure 7:
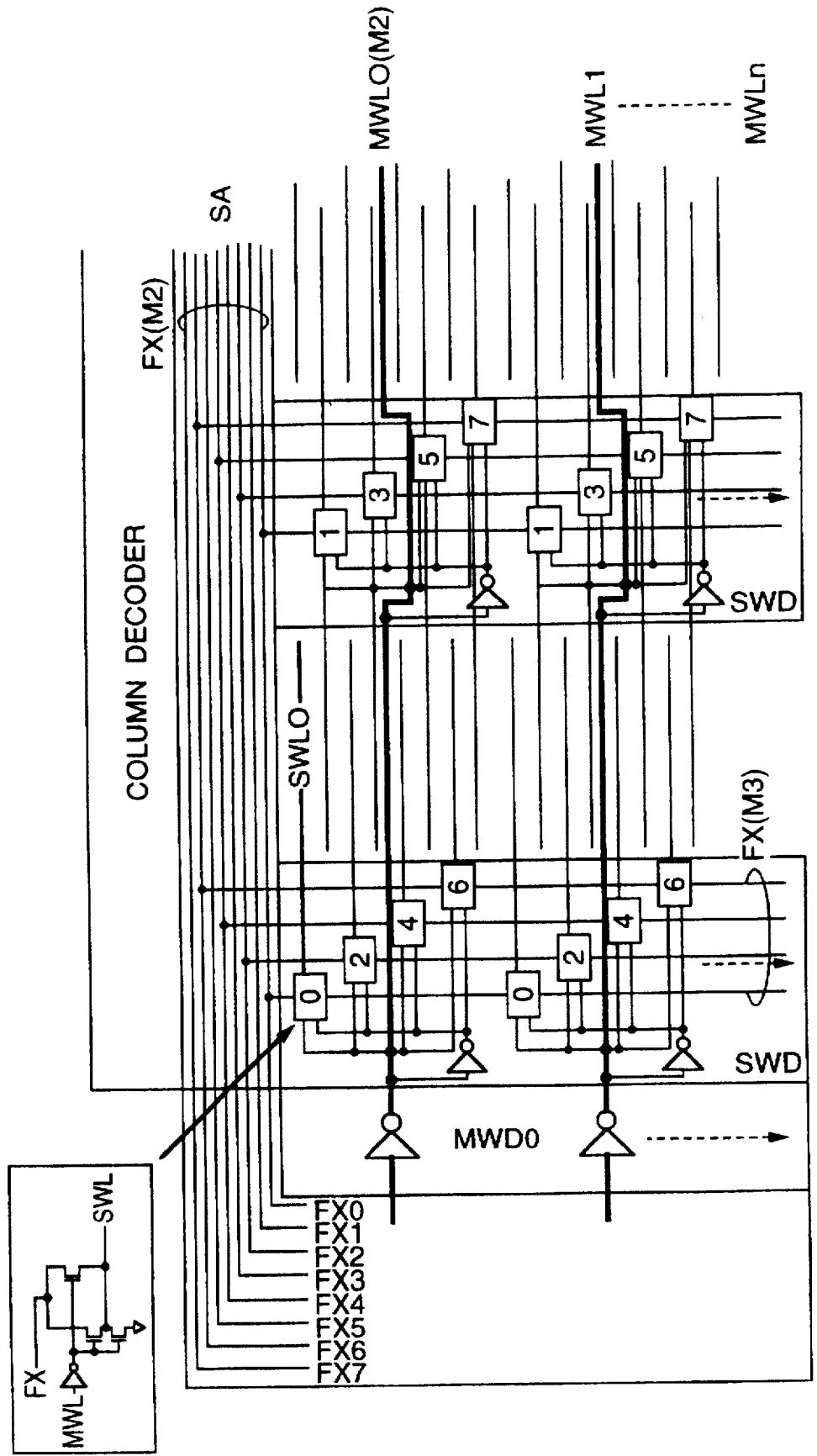
FIG. 7 is a block diagram of a main part for explaining the relations between the main word line and the subsidiary word lines in the memory array depicted in FIG. 5.

FIG. 7 shows a block diagram of a main part illustrating the relation between the main word line and the subsidiary word line in the aforementioned memory array. In FIG. 7, two main word lines MWL0 and MWL1 are shown typically. The main word line MWL0 is selected by the main word driver MWD0. The main word line MWL1 is selected by a similar main word driver.

In one main word line MWL0, eight subsidiary word lines are provided in the direction of extension of the main word line. In FIG. 7, two subsidiary word lines are exemplified as representatives of the eight main word lines. One subsidiary word line has eight subsidiary word lines so that even-numbered subsidiary word lines 0 to 6 and odd-numbered subsidiary word lines 1 to 7 are arranged alternately in one memory block. Except even-numbered subsidiary word lines 0 to 6 adjacent to the main word driver and odd-numbered subsidiary word lines 1 to 7 arranged in the farthest end side of the main word line (in the side opposite to the word driver), subsidiary word drivers disposed between memory blocks form signals for selecting subsidiary word lines in memory blocks disposed in left and right symmetrically with respect to the subsidiary word drivers.

Though each memory array is divided into eight memory blocks as described above, each memory array is divided into four blocks substantially, because subsidiary word lines corresponding to two memory blocks are selected substantially simultaneously by one subsidiary word driver. In the aforementioned configuration in which the subsidiary word lines are classified into even-numbered subsidiary word lines 0 to 6 and odd-numbered subsidiary word lines 1 to 7 and in which subsidiary word drivers are arranged in respective opposite sides of the memory blocks, the effective pitch of subsidiary word lines SWL arranged in high density correspondingly to the arrangement of memory cells can be relaxed to twice in the subsidiary word drivers, so that an efficient layout of subsidiary word drivers and subsidiary word lines can be obtained.

The aforementioned subsidiary word drivers supply selection signals shared to four subsidiary word lines 0 to 6 (or 1 to 7). The subsidiary word drivers further supply inverted signals through inverter circuits. Subsidiary word selection lines FX are provided in order to select one subsidiary word line from the four subsidiary word lines. The subsidiary word selection lines are constituted by eight lines FX0 to FX7. Among the eight lines FX0 to FX7, even-numbered lines FX0 to FX6 are supplied to the aforementioned even-numbered subsidiary word drivers 0 to 6 whereas odd-numbered lines FX1 to FX7 are supplied to the aforementioned odd-numbered subsidiary word drivers 1 to 7. Though there is no specific limitation, the subsidiary word selection lines FX0 to FX7 are constituted by a metal wiring layer M2 as a second layer in the peripheral portions of the array and are constituted by a metal wiring layer M3 as a third layer in the portions of intersection of the main word lines MWL0 to MWLn constituted by the metal wiring layer M2 as the second layer.

Figure 8:
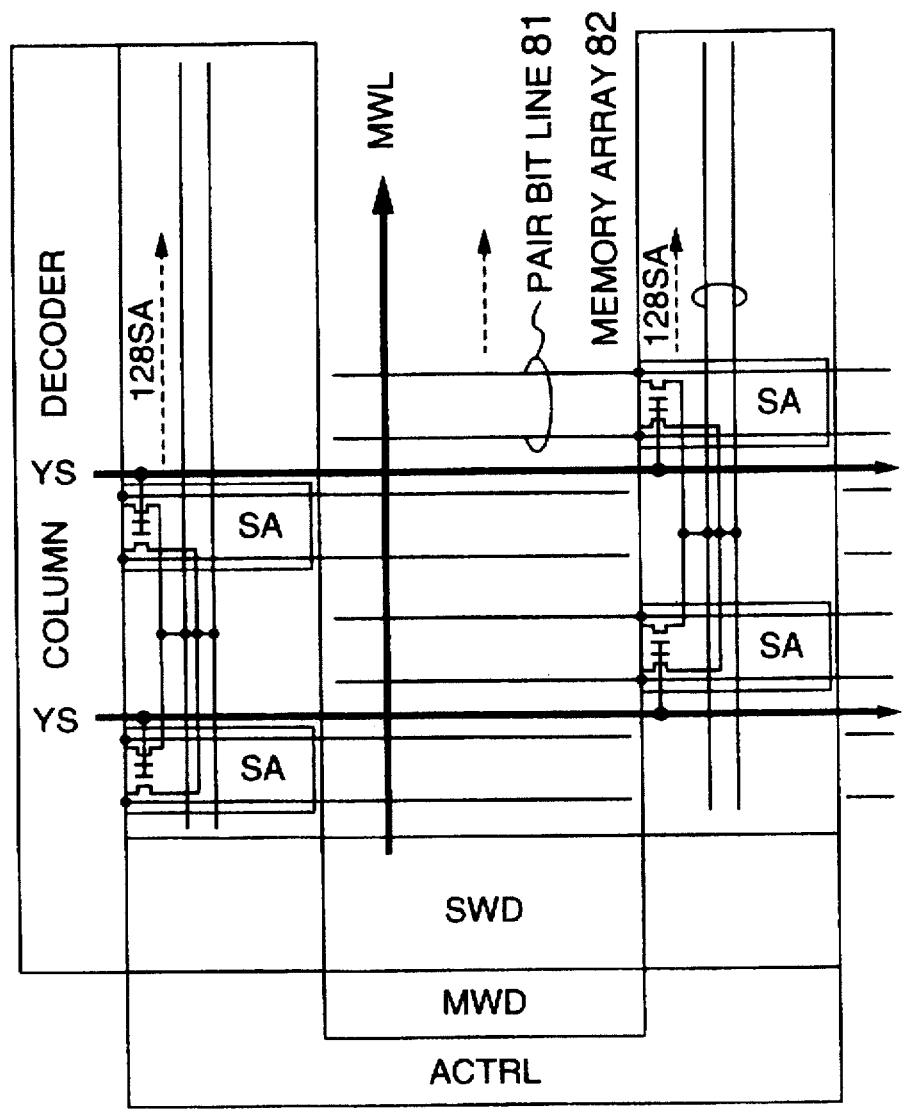
FIG. 8 is a block diagram of a main part for explaining the relations between the main word line and the sense amplifiers in the memory array depicted in FIG. 5.

FIG. 8 shows a block diagram of a main part illustrating the relation between the main word line and the sense amplifier in the aforementioned memory array. In FIG. 8, one main word line MWL is exemplified as representatives of the main word lines. The main word line MWL is selected by a main word driver MWD. A subsidiary word driver SWD corresponding to the aforementioned even-numbered subsidiary word lines is provided so as to be adjacent to the main word driver.

Though not shown in FIG. 8, complementary bit lines (Pair Bit Line) 81 are provided so as to be perpendicular to subsidiary word lines which are arranged parallelly with the main word line MWL. In this embodiment, though there is no specific limitation, complementary bit lines are also classified into even-numbered lines and odd-numbered lines so that sense amplifiers SA are disposed in left and right symmetrically with respect to the memory block (memory array) 82 correspondingly to the even-numbered and odd-numbered lines. The sense amplifiers SA are operated as a shared sense system as described above. In the sense amplifiers SA in the end portions, a complementary bit line substantially arranged in one side is not provided. The sense amplifiers SA in the end portions are connected to complementary bit lines through shared switches MOSFET.

In the aforementioned configuration in which sense amplifiers SA are distributively arranged in opposite sides of memory blocks, complementary bit lines are classified into even-numbered lines and odd-numbered lines, so that the pitch of the alignment of the sense amplifiers can be relaxed. Conversely, element areas forming sense amplifiers SA can be secured while complementary bit lines are arranged in high density. Input/output lines are arranged along the arrangement of the sense amplifiers SA. The input/output lines are connected to the complementary bit lines through column switches. The column switches are constituted by switch MOSFETs. The gates of the switch MOSFETs are connected to column selection lines YS through which column decoder selection signals are transmitted.

Figure 9:
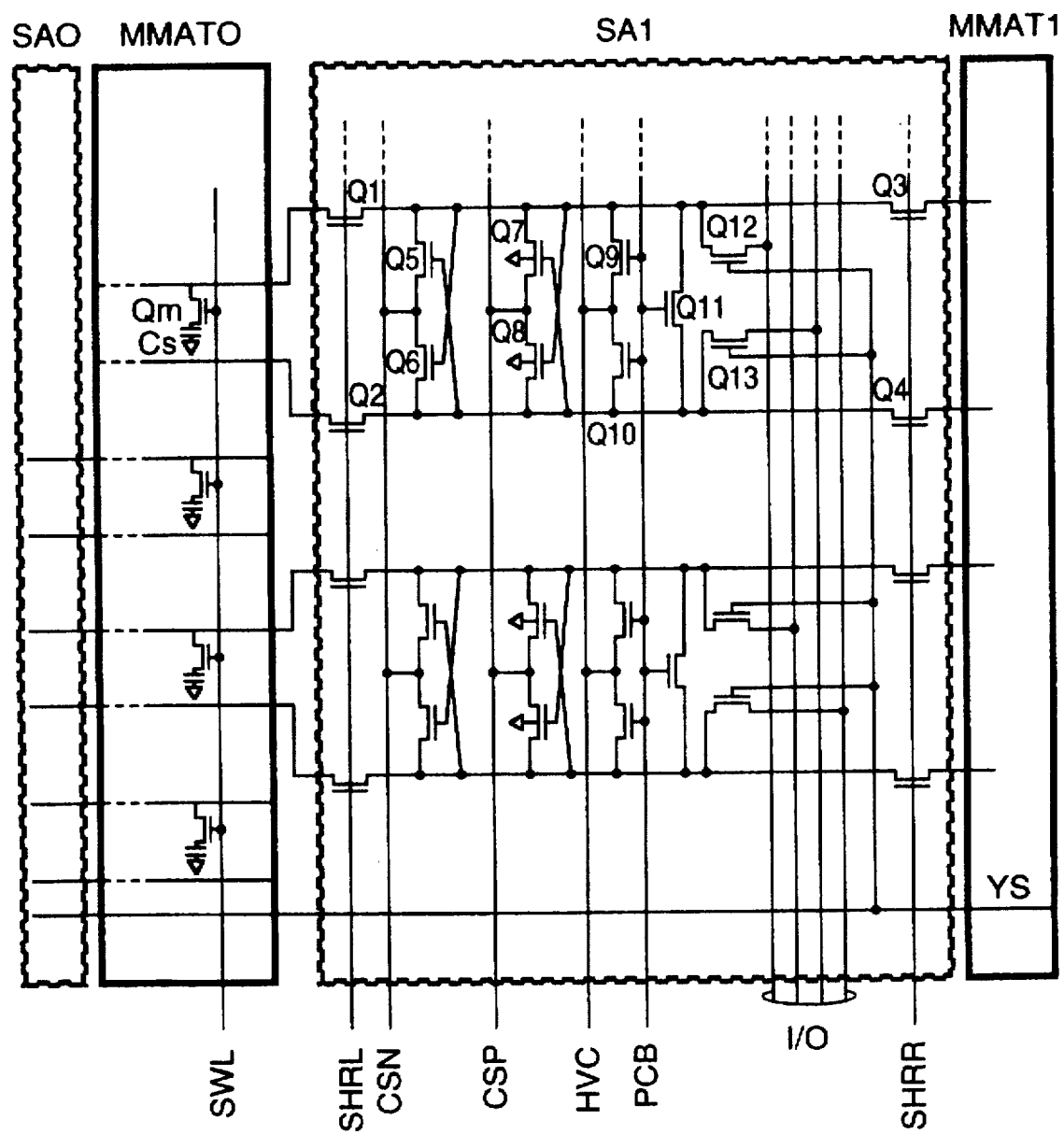
FIG. 9 is a circuit diagram of a main part showing an embodiment of the sense amplifier portion of the dynamic RAM according to the present invention.

FIG. 9 shows a circuit diagram of a main part in an embodiment of the sense amplifier portion of the dynamic RAM according to the present invention. In FIG. 9, a sense amplifier SA1 arranged so as to be sandwiched between memory mats (equivalent to the aforementioned memory blocks) MMAT0 and MMAT1 and circuits relevant to the sense amplifier SA1 are exemplified. The memory mat MMAT1 is shown as a black box, and a sense amplifier SA0 provided in an end portion is shown also as a black box.

Four dynamic memory cells corresponding to the subsidiary word line SWL provided in the memory mat MMAT0 are exemplified representatively. One dynamic memory cell is composed of an address selection MOSFET Qm and an information storage capacitor Cs. The gate of the address selection MOSFET Qm is connected to the subsidiary word line SWL. The drain of the MOSFET Qm is connected to a bit line. The information storage capacitor Cs is connected to the source of the MOSFET Qm. The other electrode of the information storage capacitor Cs is used in common so as to be supplied with a plate voltage.

A pair of complementary bit lines are arranged so as to be substantially parallel with each other as shown in FIG. 9 but suitably intersect with each other to attain capacitance balance between the bit lines, or the like, as occasion demands. The complementary bit lines are connected to an input/output node of a sense amplifier unit circuit by shared switch MOSFETs Q1 and Q2. The sense amplifier unit circuit is composed of N-channel type MOSFETs Q5 and Q6 and P-channel type MOSFETs Q7 and Q8 in which gates and drains are cross-connected to obtain a latch form. The respective sources of the N-channel type MOSFETs Q5 and Q6 are connected to a common source line CSN. The respective sources of the P-channel type MOSFETs Q7 and Q8 are connected to a common source line CSP. Power switch MOSFETs for the N-channel type MOSFETs and the P-channel type MOSFETs are provided in the common source lines CSN and CSP respectively. Each of the power switch MOSFETs is turned on by an activating signal of a sense amplifier so that a voltage required for the operation of the sense amplifier is supplied.

Each of the power switch MOSFETs (not shown) for activating the sense amplifier is constituted by two MOSFETs connected in parallel with each other. To obtain a stable sensing operation, a first power switch MOSFET capable of supplying only a relatively small current is turned on at a point of time when the sense amplifier starts its amplifying operation whereas a second power switch MOSFET capable of supplying a relatively large current is turned on at a point of time when the potential difference with respect to the complementary bit line is increased to a certain degree by the amplifying operation of the sense amplifier, so that the amplifying operation is performed stageously.

An MOSFET Q11 for short-circuiting the complementary bit lines and a pre-charge circuit composed of switch MOSFETs Q9 and Q10 for supplying a half pre-charge voltage HVC to the complementary bit lines are provided in the input/output node of the sense amplifier unit circuit. The respective gates of these MOSFETs Q9 to Q11 are supplied with a common pre-charge signal PCB.

The MOSFETs Q12 and Q13 form a column switch which is switch-controlled on the basis of the column selection signal YS. In this embodiment, four pairs of bit lines can be selected on the basis of one column selection signal YS. That is, the same column switch as described above is provided also in the sense amplifier SA0 shown as a black box. The complementary bit lines are classified into even-numbered bit lines and odd-numbered bit lines by the two sense amplifiers SA0 and SA1 through the memory mat MMAT0 disposed between the two amplifiers SA0 and SA1 so that the even-numbered bit lines and the odd-numbered bit lines are related to the sense amplifiers SA0 and SA1 respectively. Therefore, the column selection signals YS are designed to be able to select four pairs of complementary bit lines consisting of two pairs of bit lines exemplified in the sense amplifier SA1 side and two pairs of other bit lines (not shown) provided in the sense amplifier SA0 side can be selected. Every two pairs of complementary bit lines are connected to every two pairs of common input/output lines I/O through the aforementioned column switches.

The sense amplifier SA1 is connected to odd-numbered complementary bit lines in the memory mat MMAT1 through shared switch MOSFETs Q3 and Q4 in the same manner as described above. Even-numbered complementary bit lines in the memory mat MMAT1 are connected to a sense amplifier SA2 (not shown) arranged in the right side of the memory mat MMAT1 through shared switch MOSFETs corresponding to the shared switch MOSFETs Q2 and Q2. By the aforementioned repeated pattern, memory arrays are connected to sense amplifiers disposed between split memory mats (equivalent to the aforementioned memory blocks). When, for example, the subsidiary word line SWL of the memory mat MMAT0 is selected, the right shared switch MOSFET in the sense amplifier SA0 and the left shared switch MOSFET in the sense amplifier SA1 are turned on. Incidentally, in the sense amplifier SA0 in the end portion, only the right shared switch MOSFET is provided. The signal SHRL is a left shared selection signal, and the signal SHRR is a right shared selection signal.

Figure 10A:
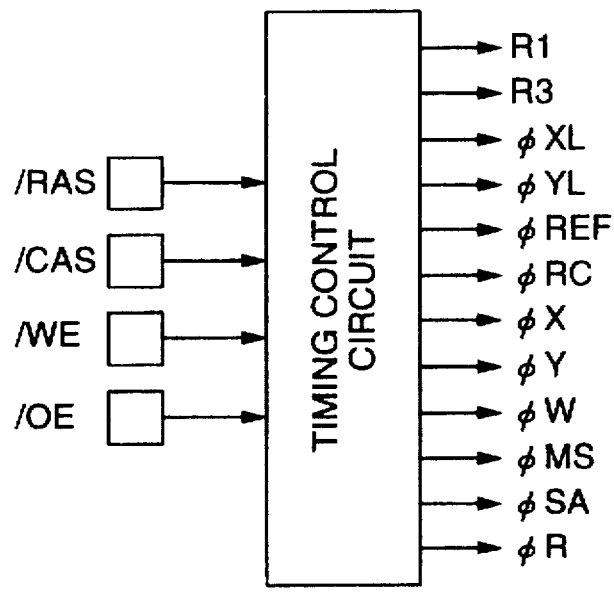
FIGS. 10A to 10C are schematic block diagrams showing an embodiment of the peripheral portion of the dynamic RAM according to the present invention.
Figure 10B:
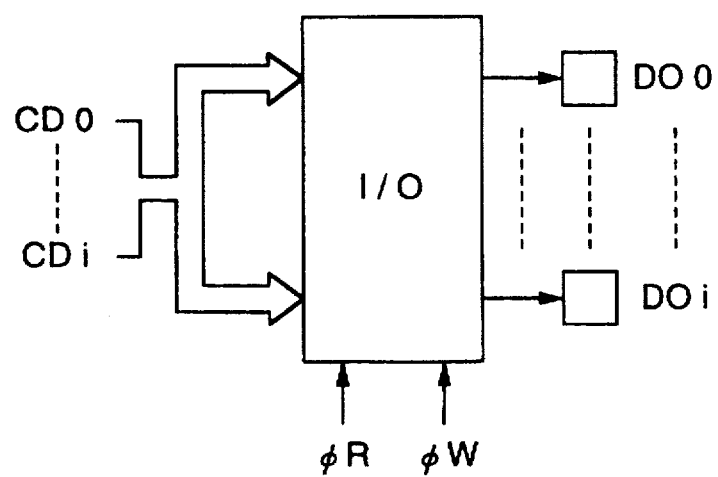
Figure 10C:
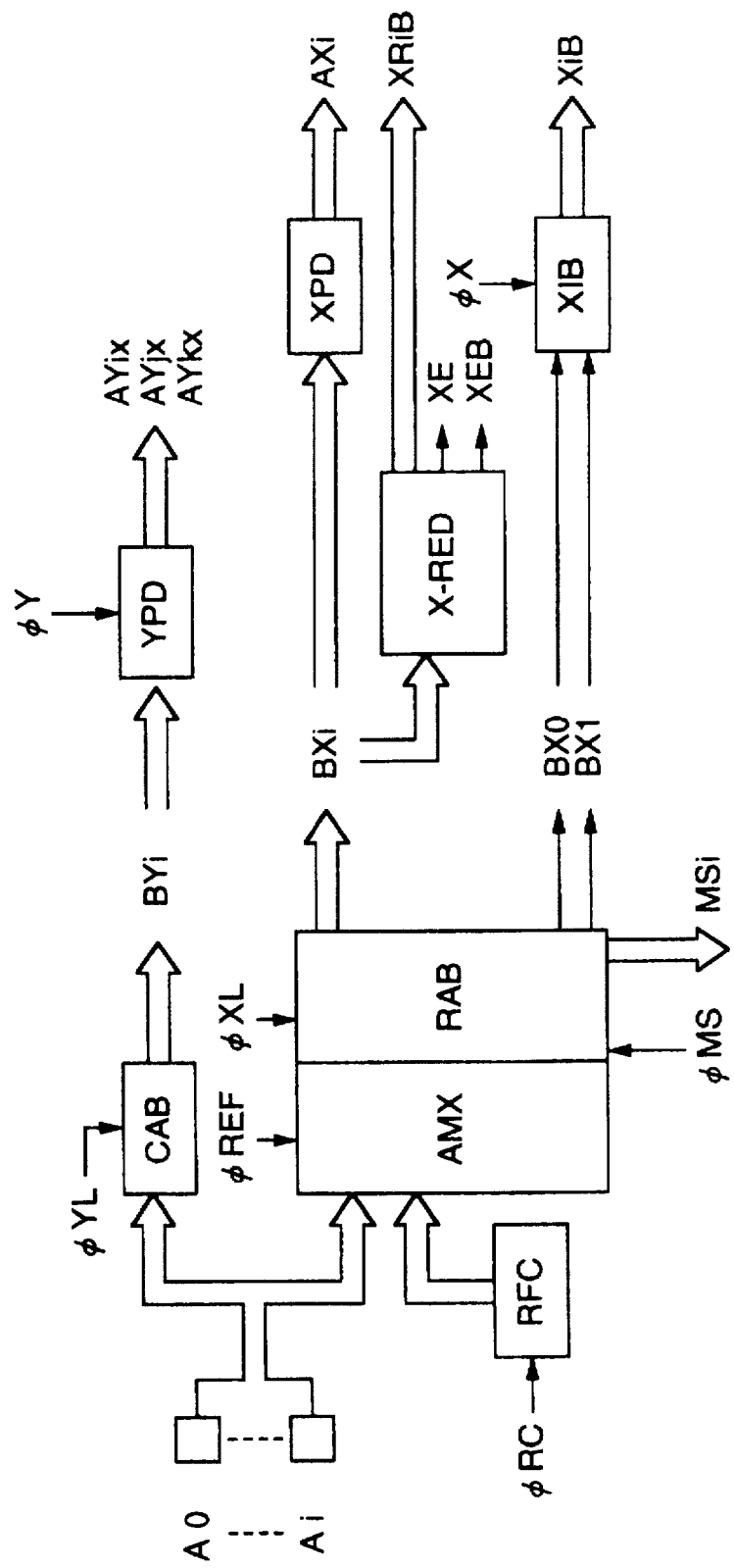

FIGS. 10A through 10C are schematic block diagrams of an embodiment of the peripheral portion of the dynamic RAM according to the present invention. In FIG. 10A, a timing control circuit TG receives a row-address strobe signal /RAS, a column address strobe signal /CAS, a write-enable signal /WE and an output-enable signal /OE supplied from external terminals, judges the operating mode and forms various types of timing signals necessary for the operations of internal circuits on the basis of the judgment. In this specification and the accompanying drawings, / is used in the meaning that the low level of the signal is its active level.

Referring to FIGS. 10A through 10C, description will be made.

The signals R1 and R3 are raw-system internal timing signals which are used for the operation of selecting a row system. The timing signal $\phi$XL is a signal for fetching and holding a row address and supplying the raw address to a row address buffer RAB. That is, the row address buffer RAB fetches an address given from address terminals A0 to Ai on the basis of the timing signal $\phi$XL and makes a latch circuit hold the address.

The timing signal $\phi$YL is a signal for fetching and holding a column address and supplying the column address to a column address buffer CAB. That is, the column address buffer CAB fetches an address given from the address terminals A0 to Ai on the basis of the timing signal $\phi$YL and makes a latch circuit hold the address.

The signal $\phi$REF is a signal generated in a refresh mode. The signal $\phi$REF is supplied to a multiplexer AMX provided in the input portion of the raw address buffer so that the signal is controlled to be switched to a refresh address signal formed by a refresh address counter circuit RFC in a refresh mode. The refresh address counter circuit RFC counts refresh stepping pulses $\phi$RC formed by the timing control circuit TG to thereby generate a refresh address signal. This embodiment is designed so that auto-refresh and self-refresh are provided as will be described later.

The timing signal $\phi$X is a word line selection timing signal which is supplied to a decoder XIB. In the decoder XIB, one of four word line selection timing signals XiB is formed on the basis of the signal obtained by decoding the address signal of lower 2 bits. The timing signal $\phi$Y is a column selection timing signal which is supplied to a column pre-decoder YPD. Column selection signals AYix, AYjx and AYkx are outputted from the column pre-decoder YPD.

The timing signal $\phi$W is a control signal for instructing a writing operation. The timing signal $\phi$R is a control signal for instructing a reading operation. These timing signals $\phi$W and φR are supplied to an input/output circuit I/O. In the writing operation, an input buffer contained in the input/output circuit I/O is activated and an output buffer is turned to an output high impedance state. On the other hand, in the reading operation, the output buffer is activated and the input buffer is turned to an output high impedance state.

Though there is no specific limitation, the timing signal φMS is a signal for instructing a memory array selecting operation. The timing signal φMS is supplied to the row address buffer RAB which outputs a selection signal MSi in synchronism with the timing signal φMS. The timing signal φSA is a signal for instructing the operation of a sense amplifier. Sense amplifier activating pulses are formed on the basis of the timing signal φSA.

In this embodiment, a row-system redundant circuit X-RED is exemplified representatively. That is, the circuit X-RED contains a storage circuit for storing a failure address, and an address comparison circuit. The failure address thus stored is compared with an address based on an internal address signal BXi outputted from the row address buffer RAB. When the two addresses do not coincide with each other, the signal XE is turned to a high level and the signal XEB is turned to a low level to thereby make the operation of a normalizing circuit effective. When the address based on the input internal address signal BXi coincides with the stored failure address, not only the signal XE is turned to a low level to thereby prohibit the normalizing circuit from selecting the failure main word line but also the signal XEB is turned to a high level to thereby generate a selection signal XRiB for selecting one reserved main word line.

Figure 11:
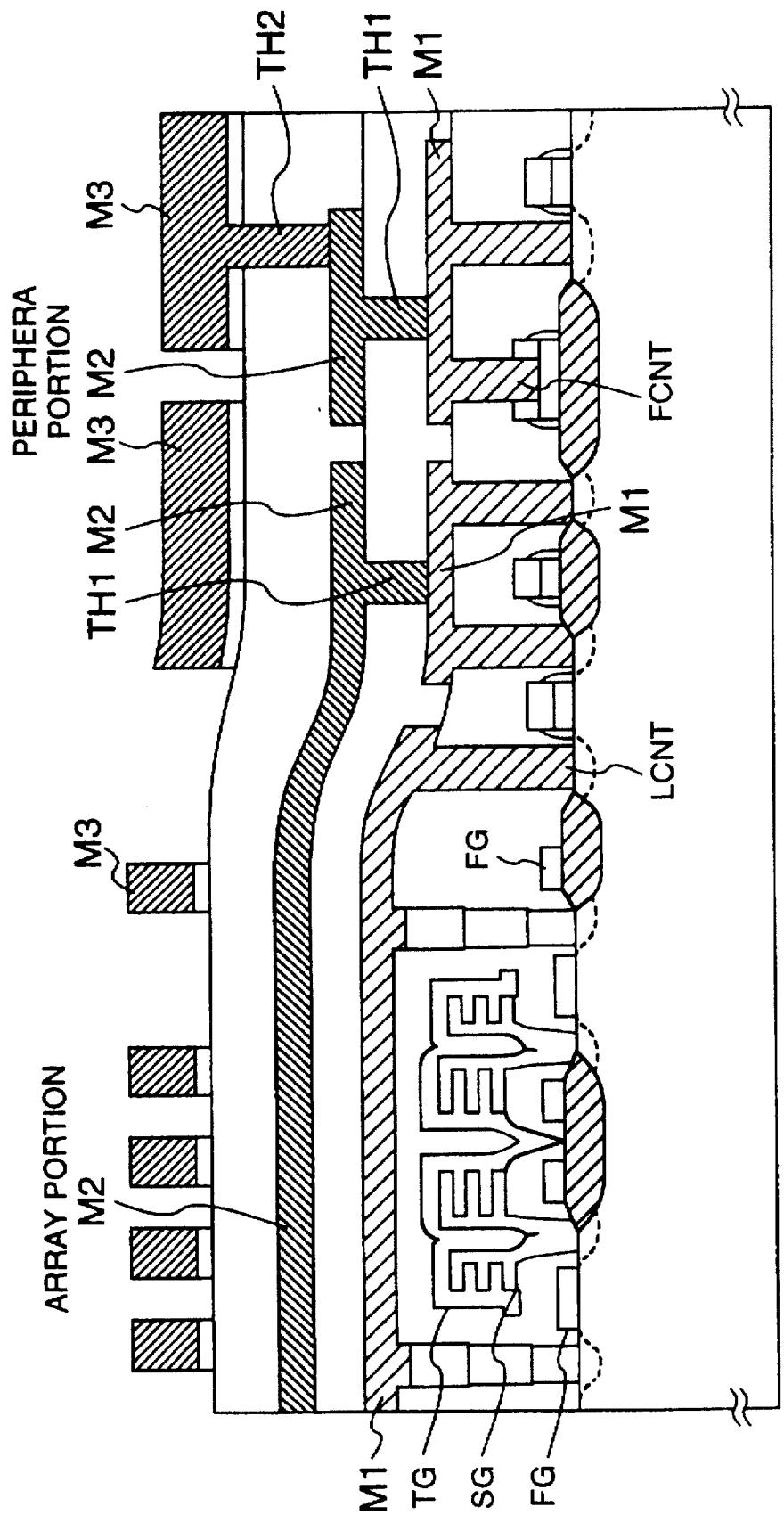
FIG. 11 is a sectional view of the structure of elements for explaining the dynamic RAM according to the present invention.

FIG. 11 is a sectional view of an element structure for explaining the dynamic RAM according to the present invention. In this embodiment, the aforementioned element structure of a memory array portion and its peripheral portion is exemplified representatively. In the storage capacitor of a memory cell, a second polysilicon layer SG is used as a storage node connected to one source and one drain of the address selection MOSFET. The second polysilicon layer is provided as a fin structure which is formed through a thin gate insulating film from a plate electrode constituted by a third polysilicon layer TG. The gate of the address selection MOSFET is constituted by a first polysilicon layer FG. The other source and the other drain of the address selection MOSFET are connected to a first metal wiring layer M1 of aluminum, or the like, through FG, SG and TG. Bit lines (or data lines or digit lines) are constituted by the wiring layer M1.

In the peripheral portion, two N-channel type MOSFETs are formed. The first wiring layer M1 is connected to the sources and drains of the MOSFETs by contact LCNT and connected to the first polysilicon layer FG by contact FCNT. The first wiring layer M1 and the second wiring layer M2 are connected to each other through a first through-hole TH1. The second wiring layer M2 and the third wiring layer M3 are connected to each other through a second through-hole TH2.

In the case where an input signal is to be supplied to the gate electrode of the aforementioned MOSFET by the second wiring layer M2, the input signal is supplied to the first wiring layer M1 as a dummy through the first through-hole TH1 as described above and then led to the first polysilicon layer FG as the gate electrode from the first wiring layer M1 through contact LCNT.

The third wiring layer M3 constituting subsidiary word selection lines as described above is connected to the second wiring layer M2 as subsidiary word selection lines through the second through-hole TH2. Further, the drains, or the like, of MOSFETs for forming the subsidiary word selection signal and the column selection signal are connected to the first wiring layer M1, are further connected to the second wiring layer M2 as a dummy through the first through-hole TH1 and are led to the subsidiary word selection lines and the Y selection lines constituted by the third wiring layer M3 through the second wiring layer M2 and the second through-hole TH2.

When the element structure as shown in this embodiment is employed, defects may occur in an insulating film between the second wiring layer M2 constituting main word lines as described above and the third wiring layer M3 constituting subsidiary word selection lines and crossing the second wiring layer M2 or between the second wiring layer M2 and the first wiring layer M1 so that leakage current which cannot be ignored is allowed to flow. Therefore, in the case where a failure occurs in reading of fine electric charge in a memory cell when such leakage current is generated, the failure main word line is replaced by a reserved main word line. Because the failure main word line remains as it is, the leakage current, however, continuously flows in the main word line. The aforementioned generation of leakage current has no influence on the memory reading/writing operation because the failure main word line is replaced by a reserved main word line. The quantity of direct current, however, increases, so that deterioration in performance of the resulting product is brought about. In the worst case, a failure occurs in the direct current. Accordingly, the aforementioned defect repairing circuit cannot be utilized, so that reduction in yield is brought about.

Figure 1:
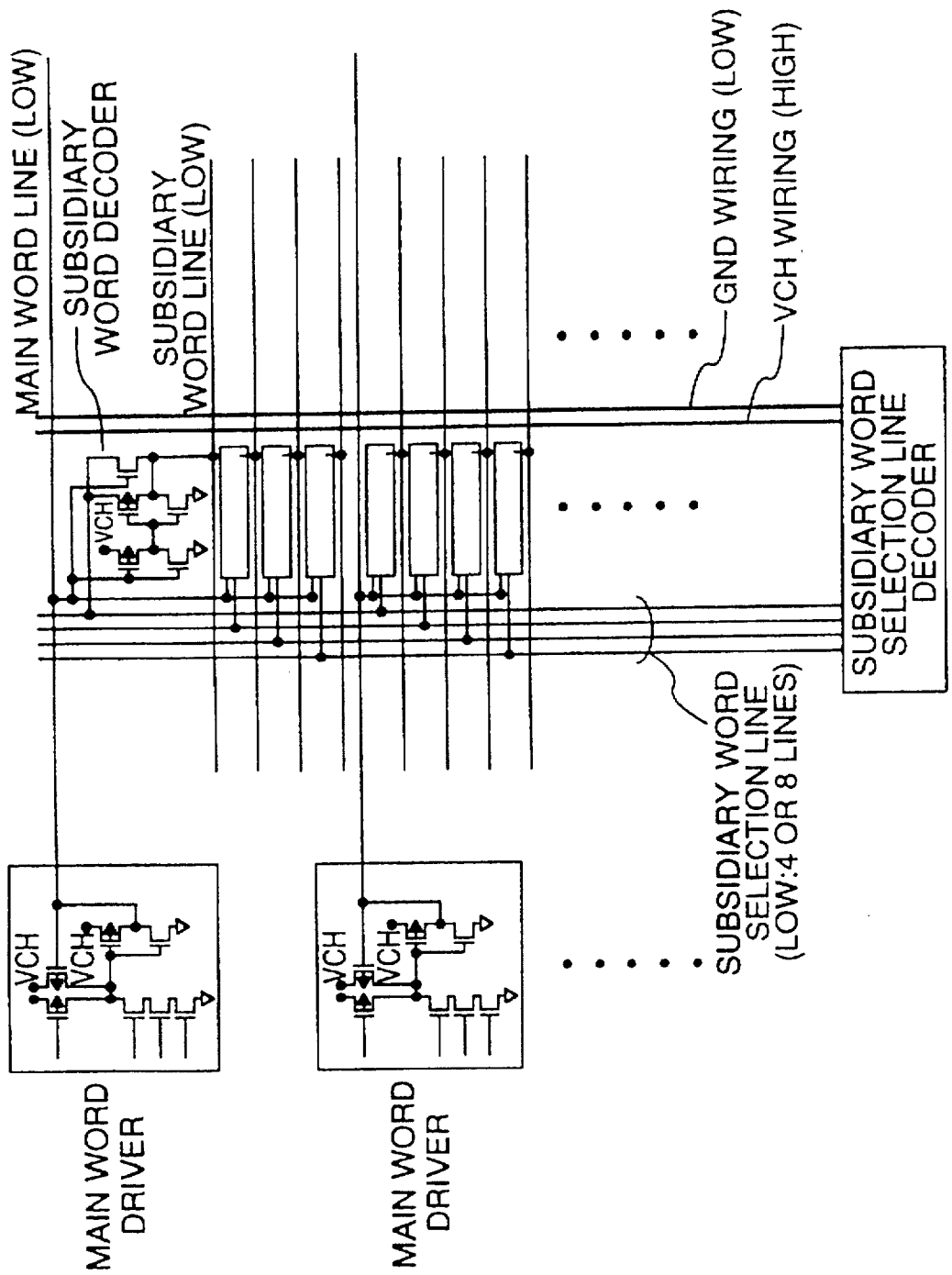
FIG. 1 is a circuit diagram showing an embodiment of a main part related to subsidiary word drivers in a dynamic RAM according to the present invention.

FIG. 1 shows a circuit diagram of an embodiment of a main part related to a subsidiary word driver in the dynamic RAM according to the present invention. Though there is no specific limitation, this embodiment shows a subsidiary word driver disposed between two memory blocks or two memory mats as represented by the subsidiary word driver corresponding to odd-numbered lines in FIG. 7.

As described above, four subsidiary word lines are provided in the bit line direction correspondingly to one main word line. The main word line is driven by a main word driver. The main word driver shown as a schematic circuit in FIG. 1 is composed of a P-channel type pre-charge MOSFET, a decoder portion constituted by series-form N-channel type MOSFETs constituting a logic block, and a drive portion constituted by a CMOS inverter circuit receiving the output signal of the decoder portion. A feedback P-channel type MOSFET is provided between an input terminal and an operating voltage terminal of the CMOS inverter circuit. A signal in the main word line is supplied to the gate of the feedback P-channel type MOSFET.

As the operating voltage for the main word driver, there is used a boosted voltage VCH obtained by boosting a source voltage VCC. Hence, the main word line selected level is set to the boosted voltage VCH which is obtained by boosting the source voltage VCC so as to be higher than the threshold voltage of the MOSFET. This reason is in that the gate voltage of the address selection MOSFET in a memory cell is made higher than the source voltage VCC so that the high-level voltage for writing data in the information storage capacitor is increased to the level of the source voltage VCC.

The subsidiary word driver exemplified as one circuit is composed of a first CMOS inverter circuit having an input connected to the main word line, a second CMOS inverter circuit aligned with the first CMOS inverter circuit in cascade for driving the subsidiary word lines, and an N-channel type MOSFET disposed between the subsidiary word selection line and the subsidiary word line. The operating voltage of the first CMOS inverter circuit is set as the boosted voltage VCH as will be described later. The operating voltage of the second CMOS inverter circuit is set to a selection voltage supplied through the subsidiary word selection line.

Each of the main word line and the subsidiary line as described above is set to a low level (Low) as represented by the ground potential of a circuit when the line is not selected. Only one subsidiary word selection line selected by the subsidiary word selection line decoder from subsidiary word selection lines provided correspondingly to four subsidiary word lines and arranged so as to be cross the main word line and the subsidiary word lines is set to a high level as represented by the boosted voltage VCH. That is, only one subsidiary selection line selected from the four subsidiary selection lines is set to the aforementioned selected level in a short time of memory access or refreshing operation.

The voltage line VCH for supplying the aforementioned operating voltage VCH to the subsidiary word driver and the ground line GND for supplying the ground potential of the circuit are arranged in parallel with the subsidiary word selection line. If eight subsidiary word lines are allocated to one main word line, eight subsidiary word selection lines are provided.

Figure 2:
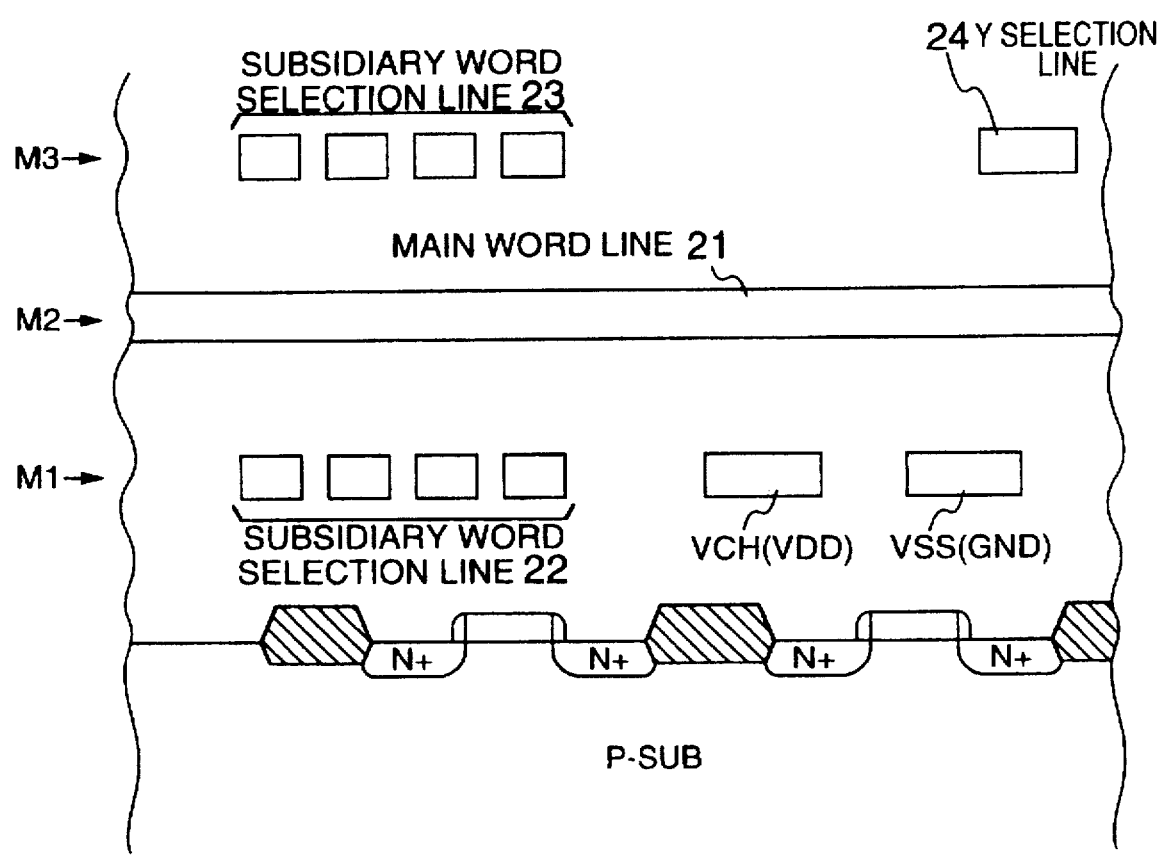
FIG. 2 is a schematic sectional arrangement view for explaining the relations between the main word line, the subsidiary word selection lines and the voltage supply lines in FIG. 1.

FIG. 2 shows a schematic sectional arrangement view for explaining the relations between a main word line 21, subsidiary word selection lines 22 and 23 and voltage supply lines. The main word line 21 is constituted by the second metal wiring layer M2. In the subsidiary word selection lines 22, portions which cross the main word line 21 are constituted by the third metal wiring layer. In the subsidiary word selection lines 22, at portions which are connected to the input of the subsidiary word driver and which do not cross the main word line, or the like, the third metal wiring layer is led to the first metal wiring layer through the second metal wiring layer M2 and connected to the source areas, or the like, of the P-channel type MOSFETs constituting the subsidiary word drivers.

Though there is no specific limitation, the boosted voltage line VCH and the ground line GND are constituted by the first metal wiring layer M1 and extended so as to cross the main word line. Further, the third metal wiring layer M3 is used for constituting the Y selection line 24. Though not shown in FIG. 2, the subsidiary word lines are constituted by the first polysilicon layer FG. To reduce the wiring resistance value of the polysilicon layer, the first polysilicon layer may be shunted to the first or second metal wiring layer. N-channel type MOSFETs are exemplified in FIG. 2 for explaining the structure of the substrate side.

In the aforementioned embodiment, both the levels of the main word line and the subsidiary word line are made to be low when the dynamic RAM is not selected. Similarly, the level of the Y selection line is made to be low. Furthermore, the level of the subsidiary word selection line is made to be low. In FIG. 2, accordingly, only the boosted voltage VCH is in a different voltage level. Only in the case where a failure occurs in insulation between the boosted voltage line VCH and the main word line which crosses the boosted voltage line VCH, a leakage current flows. This means that no leakage current flows in a stationary state even in the case where a failure occurs in insulation between the main word line and the subsidiary word selection line. Therefore, even if the failure in insulation makes memory access impossible, a failure in memory access can be avoided by switching the failure main word line to a redundant main word line.

Although the aforementioned failure still remains in insulation between the failure main word line and the subsidiary word selection line, the aforementioned voltage setting can substantially prevent a leakage current from flowing. That is, in the four subsidiary word selection lines, a leakage current is generated only in a very short time of memory access, so that the leakage current disappears substantially because of a current consumed by simultaneous operations of circuits at the time of memory access. Further, because the potential of the main word line is equal to the potential of the subsidiary word selection line to thereby prevent a leakage current from flowing even in the case where a failure occurs in insulation when the RAM is not selected, the failure in insulation can be prevented from causing a current failure in a stand-by state.

In such a structure in which, like the above-mentioned known example, main word lines and subsidiary word lines substantially same as those in the present invention are provided and a complementary selection signal is supplied to a subsidiary word selection line for selecting a subsidiary word line even though the selection level and the not-selected level are made to be equal in potential to each other in the relation between the main word line and the subsidiary word line, it means that, even in the memory access state or stand-by state, the level of one of two selection lines is made to be high, for example, in the case of two selection lines, while the levels of two of four selection lines are made to be high, for example, in the case of four selection lines. Accordingly, in comparison between the structure according to the present invention and the conventional structure in which four subsidiary word selection lines equal in number to the present invention are used as shown in FIG. 2, the present invention has a problem only in the case where a failure occurs in insulation between the main word line and an electric source line corresponding to VCH among seven lines crossing the main word line whereas the known example has a problem in the case where a failure occurs in insulation similarly between the main word line and each of three lines consisting of a source voltage line and two subsidiary word selection lines among the seven lines. By employing the structure of the present invention as described above, the probability that a failure occurs in insulation can be reduced to ⅓ compared with the probability of an insulation failure in the conventional case.

Figure 3:
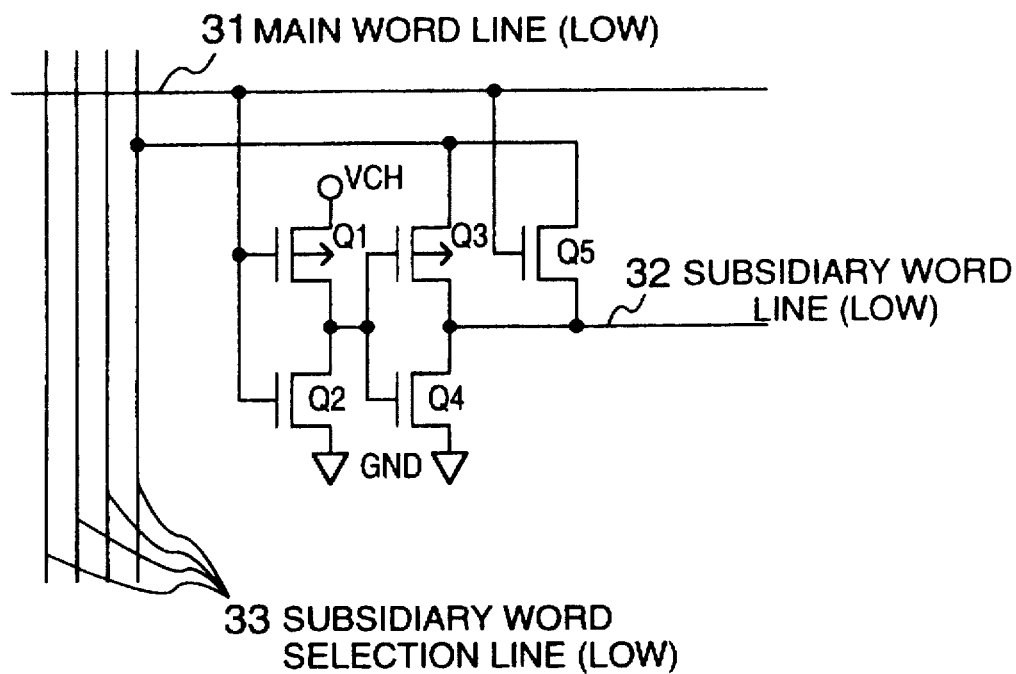
FIG. 3 is a circuit diagram showing an embodiment of the subsidiary word drivers (the subsidiary word decoders) depicted in FIG. 1.

FIG. 3 shows a circuit diagram of an embodiment of the subsidiary word driver (the subsidiary word decoder). Although the circuit symbols given to the respective circuit elements in FIG. 3 overlap those in FIG. 9 as described above, the circuit symbols have individual circuit functions respectively. This rule applies to FIG. 4 explained as follows.

In this embodiment, the main word line 31 is connected to an input terminal of a first CMOS inverter circuit composed of a P-channel type MOSFET Q1 and an N-channel type MOSFET Q2. The output signal of the first CMOS inverter circuit is transmitted to an input terminal of a second CMOS inverter circuit composed of a P-channel type MOSFET Q3 and an N-channel type MOSFET Q4. The second CMOS inverter circuit forms a signal for selecting a subsidiary word line 32. The source of the P-channel type MOSFET Q3 in the second CMOS inverter circuit is connected to one of subsidiary word selection lines 33. That is, the second CMOS inverter circuit is designed to have a logic circuit function for forming a high-level subsidiary word selection signal when both the main word line 31 and the subsidiary word selection line 32 are set to a high level. An N-channel type MOSFET Q5 is provided between the subsidiary word line and the subsidiary word selection line. The gate of the MOSFET Q5 is connected to the main word line.

The operating voltage of the first CMOS inverter circuit is set as the boosted voltage VCH. Further, the selected level transmitted to the main word line and the subsidiary word selection line is set to the same high level as the level of the boosted voltage VCH. Therefore, the operating voltage of a decoder for supplying a selection signal to the main word driver or the subsidiary word selection line is set as the boosted voltage VCH in the same manner as the first CMOS inverter circuit. The boosted voltage VCH is formed by a boosted voltage generating circuit composed of an oscillation circuit and a charge pump circuit.

Though there is no specific limitation, the output signal of the first CMOS inverter circuit can be used in common to subsidiary word drivers provided in the remaining three subsidiary word lines as exemplified by the schematic circuit of FIG. 7. When the main word line is turned to a high level, the output signal of the first CMOS inverter circuit is turned to a low level and the P-channel type MOSFET Q3 in the second CMOS inverter circuit is turned on so that the high level of VCH, or the like, given from the subsidiary word selection line is transmitted to the subsidiary word line. When the main word line is selected as described above and the level of the subsidiary word selection line is low to indicate a not-selected state, the N-channel type MOSFET Q5 is turned on and the low level of the subsidiary word selection line is transmitted to the subsidiary word line to thereby turn the subsidiary word line to a low level indicating a not-selected state. When the main word line is turned to a low level indicating a not-selected state, the output signal of the first CMOS inverter circuit is turned to a high level, the P-channel type MOSFET Q3 in the second CMOS inverter circuit is turned off, and the N-channel type MOSFET Q4 in the second CMOS inverter circuit is turned on so that the subsidiary word line is turned to a low level indicating a not-selected state.

Figure 4:
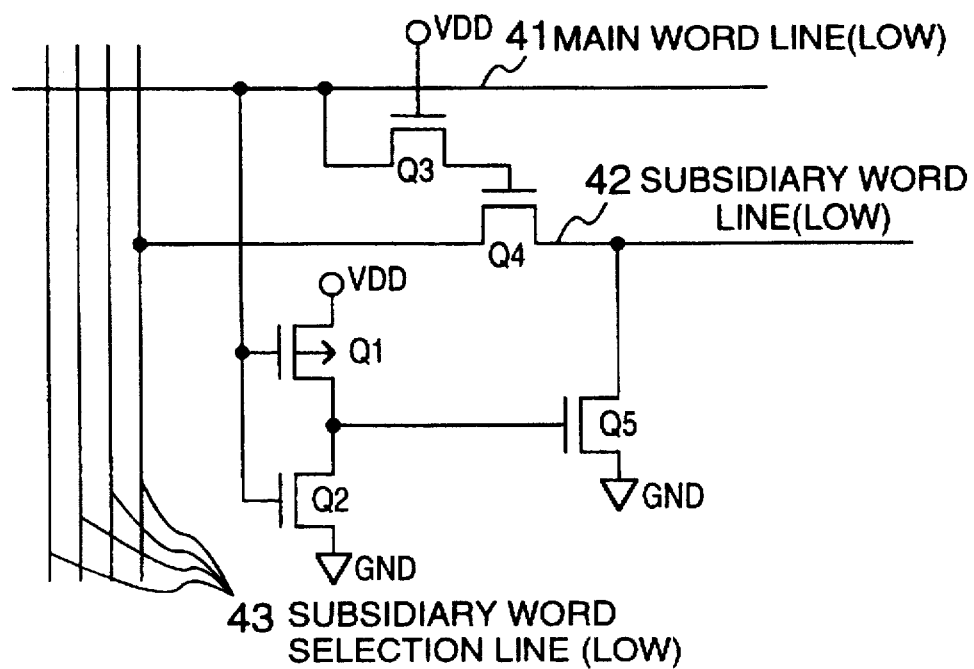
FIG. 4 is a circuit diagram showing another embodiment of the subsidiary word drivers depicted in FIG. 1.

FIG. 4 shows a circuit diagram of another embodiment of the subsidiary word driver. The main word line 41 is connected to an input terminal of a CMOS inverter circuit composed of a P-channel type MOSFET Q1 and an N-channel type MOSFET Q2 in the same manner as in FIG. 3. The output signal of the CMOS inverter circuit is transmitted to the gate of an N-channel type MOSFET Q5 provided between the subsidiary word line 42 and the ground potential of the circuit. An N-channel type MOSFET Q4 is provided between the subsidiary word selection line 42 and the subsidiary word line. A cutting MOSFET Q3 having a gate to which a source voltage VDD is applied is provided between the gate of the MOSFET Q4 and the main word line. The operating voltage for the CMOS inverter circuit is set to the source voltage VDD, unlike in the embodiment of FIG. 3. In this embodiment, therefore, the operating voltage for the subsidiary word driver is set as the source voltage VDD.

Further, the level of the main word line selection signal is made to be high to be equal to the level of the source voltage VDD. That is, the level of the main word selection signal is not made to be equal to the boosted voltage VCH but to be equal to the source voltage VDD which is generally used. Further, only the level of a signal for selecting a subsidiary word selection line is made to be high corresponding to the level of the boosted voltage VCH. In this embodiment, therefore, only a decoder for supplying a selection signal to the subsidiary word selection line uses the boosted voltage, so that the load imposed on the boosted voltage generating circuit can be lightened. In other words, the current supply capacity of the boosted voltage generating circuit can be reduced, so that not only the size of the capacitor and MOSFET used in the boosted voltage generating circuit can be reduced but also the consumed current can be reduced.

In this embodiment, a time lag is provided between the main word line and the subsidiary word selection line. That is, the main word line is preferentially selected so that the main word line is turned to a high level equal to the level of the source voltage VDD. The high-level voltage is transmitted to the gate of the MOSFET Q4 through the MOSFET Q3. Accordingly, the MOSFET Q4 is turned on, so that the potential between the gate and the channel is charged up to VDD-VTH (VTH is the threshold voltage of the MOSFET Q3). Succeedingly, the subsidiary word selection line is turned to a high level equal to the level of VCH. Accordingly, the boosted voltage is transmitted to the channel of the MOSFET Q4, so that the level of the gate is increased by the pre-charged voltage. That is, the MOSFET Q4 transmits the same high level as the level of VCH in the subsidiary word selection line to the subsidiary word line directly by a self bootstrap function. In this occasion, the MOSFET Q3 is turned off, so that the gate voltage of the MOSFET Q4 is increased.

Incidentally, when the main word line is turned to a selected level and the subsidiary word selection line is turned to a low level, the low level of the subsidiary word selection line is transmitted to the subsidiary word line through the MOSFET Q4. When the main word line is in a low level indicating a not-selected state, the output signal of the CMOS inverter circuit is tuned to a high level so that the MOSFET Q5 is turned on and the subsidiary word line is fixed to a low level.

In this embodiment, the aforementioned subsidiary word driver is constituted by five elements in the same number of elements as in the circuit of FIG. 3. Because the number of P-channel type MOSFETs can be, however, set to one if the MOSFET Q6 as the P-channel type MOSFET is driven, the subsidiary word driver can be formed in small size. Accordingly, the area occupied by elements as a whole can be reduced, so that high-density arrangement of elements can be made. Further, in this case, the source line VCH in FIG. 2 is replaced by the source line VDD.

Also in the aforementioned subsidiary word driver, the respective not-selected levels of the main word line, the subsidiary word line and the subsidiary word selection line are made to be low, so that any influence of a failure in insulation on the main word line can be eliminated substantially.

The operations and effects obtained from the aforementioned embodiments are as follows.

(1) A dynamic RAM comprises: a main word line; a plurality of subsidiary word lines which are arranged in the direction of bit lines crossing the main word line and to which a plurality of dynamic memory cells are connected; a plurality of subsidiary word selection lines which are extended so as to perpendicularly intersect the main word line and through which a selection signal for selecting one of the plurality of subsidiary word lines is transmitted; and a logic circuit for receiving a selection signal from the main word line and a selection signal from each of the subsidiary word selection lines to thereby form a selection signal for selecting one of the subsidiary word lines; wherein a voltage level of each of the main word line and the subsidiary word selection lines is set to be equal to a ground potential when the line is not selected. By the above-configuration, a leakage current can be prevented from flowing even in the case where a failure occurs in insulation between the main word line and the subsidiary word selection signal lines perpendicular to the main word line. Accordingly, there arises an effect that direct-current defects can be repaired.

(2) The aforementioned logic circuit includes: a first CMOS inverter circuit which receives a signal on the main word line and which uses, as its operating voltage, a boosted voltage corresponding to a subsidiary word line selection signal in a memory cell; a second CMOS inverter circuit which uses, as its operating voltage, an output signal of the first CMOS inverter circuit and a selection signal transmitted to the subsidiary word selection line to thereby form a drive signal to be transmitted to the subsidiary word line; and an N-channel type MOSFET provided between the subsidiary word line and the subsidiary word selection line and having its gate connected to the main word line. There arises therefore an effect that a subsidiary word line selection signal can be formed so that the subsidiary word line selection signal is turned to a high level when both the respective levels of the main word line and the subsidiary word selection line are high, and that both the respective levels of the main word line and the subsidiary word selection line can be turned to low when the lines are not selected.

(3) The aforementioned logic circuit includes: an N-channel type drive MOSFET which transmits a selection signal on each of the subsidiary word selection lines to each of the subsidiary word lines; an N-channel type cutting MOSFET which is provided between a gate of the drive MOSFET and the main word line and which has its gate supplied with a source voltage stationarily; a CMOS inverter circuit which receives a signal from the main word line and which uses the source voltage as its operating voltage; and an N-channel type switch MOSFET which has its gate supplied with an output signal of the CMOS inverter circuit and which is provided between the subsidiary word line and a ground potential of the logic circuit. There arises therefore an effect that a subsidiary word line selection signal can be formed so that the subsidiary word line selection signal is turned to a high level when both the respective levels of the main word line and the subsidiary word selection line are high, that both the respective levels of the main word line and the subsidiary word selection line can be turned to be high when those lines are not selected, and that not only the area occupied by the subsidiary word drivers can be reduced but also the current supply capacity of the boosted voltage generating circuit can be reduced.

(4) The main word line is constituted by a second metal wiring layer whereas the subsidiary word selection lines are configured by using a third metal wiring layer, the second metal wiring layer and a first metal wiring layer so that the third metal wiring layer is used in the portions where the subsidiary word selection lines and the main word line are crossed each other and the first metal wiring layer is used in the portions where the subsidiary word selection lines are connected to circuit elements constituting the logic circuit. There arises therefore an effect that the influence of a failure in insulation between the wiring lines can be reduced by turning the respective levels of the lines to be low in the aforementioned not-selected state.

(5) In the dynamic RAM in which the main and subsidiary word lines are provided with redundant main and subsidiary word lines for repairing defects, a failure main word line is substantially fixed to a not-selected level. There arises therefore an effect that the influence of a failure in insulation between the main word line and the subsidiary word line can be reduced by setting the not-selected level of the subsidiary word selection signal to be low.

Although the present invention has been described specifically on the basis of embodiments thereof, it is a matter of course that the present invention is not limited to the specific embodiments and that various changes may be made in a scope without departing from the spirit of the invention. For example, various mode can be carried out in the configuration of memory arrays, or the arrangement of memory arrays mounted on a semiconductor chip, in accordance with the storage capacity thereof, or the like. Further, the input/output interface portion may be provided as a synchronous dynamic RAM which is designed so as to be operated in synchronism with a clock signal. The number of subsidiary word lines allocated to one main word line may be designed so as to be four as described above or may be designed so as to be an arbitrary number such as eight. The present invention can be widely applied to a split word line type dynamic RAM having a main word line and subsidiary word lines. The effect of the present invention is obtained even in the case where both the respective levels of the main word line and the subsidiary word selection line are set to be high.

What is claimed is:

1. A dynamic RAM comprising:
   a main word line;
   a plurality of bit lines which are perpendicular to said main word line;
   a plurality of dynamic memory cells which are connected to said plurality of bit lines;
   a plurality of subsidiary word lines which are parallel to said main word line;
   a plurality of subsidiary word selection lines which are extended so as to perpendicularly intersect said main word line and through which a selection signal for selecting one of said plurality of subsidiary word lines is transmitted; and
   a logic circuit for receiving a selection signal from said main word line and a selection signal from each of said subsidiary word selection lines to thereby form a selection signal for selecting one of said subsidiary word lines;
   wherein a voltage level of each of said main word line and said subsidiary word selection lines is set to be equal to a ground potential when the line is not selected.

2. A dynamic RAM according to claim 1, wherein said logic circuit includes:
   a first CMOS inverter circuit which receives a signal on said main word line and which uses, as its operating voltage, a boosted voltage corresponding to a subsidiary word line selection signal in a memory cell;
   a second CMOS inverter circuit which uses, as its operating voltage, an output signal of said first CMOS inverter circuit and a selection signal transmitted to said subsidiary word selection line to thereby form a drive signal to be transmitted to said subsidiary word line; and
   an N-channel type MOSFET provided between said subsidiary word line and said subsidiary word selection line and having its gate connected to said main word line.

3. A dynamic RAM according to claim 1, wherein said logic circuit includes:
   an N-channel type drive MOSFET which transmits a selection signal on each of said subsidiary word selection lines to each of said subsidiary word lines;

an N-channel type cutting MOSFET which is provided between a gate of said drive MOSFET and said main word line and which has its gate supplied with a source voltage stationarily;

a CMOS inverter circuit which receives a signal from said main word line and which uses the source voltage as its operating voltage; and an N-channel type switch MOSFET which has its gate supplied with an output signal of said CMOS inverter circuit and which is provided between said subsidiary word line and a ground potential of said logic circuit.

4. A dynamic RAM according to claim 1, wherein: said main word line is constituted by a second metal wiring layer; and said subsidiary word selection lines are constituted by a third metal wiring layer, said second metal wiring layer and a first metal wiring layer, said third metal wiring layer being used in portions where said subsidiary word selection lines cross said main word line, and said first metal wiring layer being used in portions where said subsidiary word selection lines are connected to circuit elements constituting said logic circuit.

5. A dynamic RAM according to claim 4, wherein said main word line and said subsidiary word lines are provided with a redundant main word line and redundant subsidiary word lines for repairing defects.

6. A semiconductor memory device comprising:

a main word line extended in a first direction;

a plurality of first subsidiary word lines each extended in said first direction, said first subsidiary word lines being arranged side by side;

a plurality of second subsidiary word lines each extended in said first direction, said second subsidiary word lines being arranged side by side;

a plurality of first memory cells connected to said plurality of first subsidiary word lines;

a plurality of second memory cells connected to said plurality of second subsidiary word lines;

a plurality of first selection lines each extended in a second direction said first selection lines being arranged side by side;

a plurality of second selection lines each extending in said second direction, said second selection lines being arranged side by side;

a first selection circuit connected to said main word line, said plurality of first selection lines and said plurality of first subsidiary word lines, and for turning a state of selected one of said plurality of first subsidiary word lines into a selected state in accordance with signals on said main word line and said plurality of first selection lines; and a second selection circuit connected to said main word line, said plurality of second selection lines and said plurality of second subsidiary word lines, and for turning a state of selected one of said plurality of second subsidiary word lines into a selected state in accordance with signals on said main word line and on said plurality of second selection lines;

wherein said main word line and said plurality of first selection lines are arranged on a semiconductor substrate so as to cross each other through an isolating layer, wherein said main word line and said plurality of second selection lines are arranged on said semiconductor substrate so as to cross each other through said isolating layer, and wherein a not-selected level of each of said main word line, said plurality of first selection lines and said plurality of second selection lines is set to be equal to a ground potential.

7. A semiconductor memory device according to claim 6, wherein said plurality of first memory cells and said plurality of second memory cells are of a dynamic type.

8. A semiconductor memory device according to claim 6, wherein each of said first selection circuit and said second selection circuit has a decoding function.

9. A semiconductor memory device comprising:

a first word line extended in a first direction;

a plurality of second word lines each extended in said first direction, said second word lines being arranged side by side;

a plurality of third word lines each extended in said first direction, said third word lines being arranged side by side;

a plurality of first memory cells connected to said plurality of second word lines;

a plurality of second memory cells connected to said plurality of third word lines;

a plurality of first selection lines extended in a second direction, substantially perpendicular to a first direction, said first selection lines being arranged side by side;

a plurality of second selection lines each extended in said second direction, said second selection lines being arranged side by side;

a first selection circuit connected to said first word line, said plurality of first selection lines and said plurality of second word lines, and for selecting one of said plurality of second word lines in accordance with signals on said first word line and said plurality of first selection lines; and a second selection circuit connected to said first word line, said plurality of second selection lines and said plurality of third word lines, and for selecting one of said plurality of third word lines in accordance with signals on said first word line and said plurality of second selection lines;

wherein said first word line and said plurality of first selection lines are arranged on a semiconductor substrate so as to cross each other through an isolating layer, wherein said first word line and said plurality of second selection lines are arranged on said semiconductor substrate so as to cross each other through said isolating layer, wherein a not-selected level in each of said plurality of first selection lines is substantially the same as a not-selected level of said first word line, and wherein a not-selected level of each of said plurality of second selection lines is substantially the same as a not-selected level of said first word line.

10. A semiconductor memory device according to claim 9, wherein said plurality of first memory cells and said plurality of second memory cells are of a dynamic type.

11. A semiconductor memory device according to claim 9, wherein each of said first selection circuit and said second selection circuit has a decoding function.

12. A semiconductor memory device comprising:

(1) a first main word line extended in a first direction;

(2) a second main word line extended in said first direction;

(3) a plurality of first sub-word lines each extended in said first direction, said first sub-word lines being arranged side by side;

(4) a plurality of second sub-word lines each extended in said first direction, said plurality of second sub-word lines being arranged side by side;

(5) a plurality of third sub-word lines each extended in said first direction, said third sub-word lines being arranged side by side;

(6) a plurality of fourth sub-word lines each extended in said first direction, said fourth sub-word lines being arranged side by side;

(7) a plurality of first memory cells connected to said plurality of first sub-word lines;

(8) a plurality of second memory cells connected to said plurality of second sub-word lines;

(9) a plurality of third memory cells connected to said plurality of third sub-word lines;

(10) a plurality of fourth memory cells connected to said plurality of fourth sub-word lines;

(11) a plurality of first selection lines each extended in a second direction, substantially perpendicular to the first direction, said first selection lines being arranged side by side;

(12) a plurality of second selection lines each extended in said second direction, said second selection lines being arranged side by side;

(13) a first selection circuit connected to said first main word line, said plurality of first selection lines and said plurality of first sub-word lines, and for changing a level of one of said plurality of first sub-word lines from a not-selected level to a selected level in accordance with signals on said first main word line and said plurality of first selection lines;

(14) a second selection circuit connected to said first main word line, said plurality of second selection lines and said plurality of second sub-word lines, and for changing a level of one of said plurality of second sub-word lines from a not-selected level to a selected level in accordance with signals on said first main word line and said plurality of second selection lines;

(15) a third selection circuit connected to said second main word line, said plurality of first selection lines and said plurality of third sub-word lines, and for changing a level of one of said plurality of third sub-word lines from a not-selected level to a selected level in accordance with signals on said second main word line and said plurality of first selection lines; and

(16) a fourth selection circuit connected to said second main word line, said plurality of second selection lines and said plurality of fourth sub-word lines, and for changing a level of one of said plurality of fourth sub-word lines from a not-selected level to a selected level in accordance with signals on said second main word line and said plurality of second selection lines;

wherein said first main word line and said plurality of first selection lines are arranged on a semiconductor substrate so as to cross each other through a semiconductor layer, wherein said first main word line and said plurality of second selection lines are arranged on said semiconductor substrate so as to cross each other through said predetermined layer, said second main word line and said plurality of first selection lines are arranged on said semiconductor substrate so as to cross each other through said predetermined layer, wherein said second main word line and said plurality of second selection lines are arranged on said semiconductor substrate so as to cross each other through said predetermined layer, wherein a not-selected level of each of said plurality of first selection lines is substantially the same as a not-selected level of said first main word line, wherein a not-selected level of each of said plurality of second selection lines is substantially the same as said not-selected level of said first main word line, wherein said not-selected level of each of said plurality of first selection lines is substantially the same as a not-selected level of said second main word line, and wherein said not-selected level of each of said plurality of second selection lines is substantially the same as said not-selected level of said second main word line.

13. A semiconductor memory device according to claim 12, wherein said not-selected level of each of said first main word line, said second main word line, said plurality of first selection lines and said plurality of second selection lines is set to be equal to a ground potential.

14. A semiconductor memory device according to claim 12, wherein said first main word line and said plurality of first selection lines are formed on said semiconductor substrate so as to cross each other through an isolating layer, wherein said first main word line and said plurality of second selection lines are formed on said semiconductor substrate so as to cross each other through said isolating layer, wherein said second main word line and said plurality of first selection lines are formed on said semiconductor substrate so as to cross each other through said isolating layer, and wherein said second main word line and said plurality of second selection lines are formed on said semiconductor substrate so as to cross each other through said isolating layer.

15. A semiconductor memory device according to claim 12, wherein said plurality of first memory cells, said plurality of second memory cells, said plurality of third memory cells and said plurality of fourth memory cells are of a dynamic type.

16. A semiconductor memory device according to claim 12, wherein each of said first selection circuit, said second selection circuit, said third selection circuit and said fourth selection circuit has a decoding function.

17. A semiconductor memory device formed on a semiconductor substrate on which a first wiring layer, a second wiring layer and an isolating layer disposed between said first and second wiring layers are formed, said semiconductor storage device comprising:

(1) a first word line extended in a first direction;

(2) a plurality of second word lines each extended in said first direction, said second word lines being arranged side by side, each of said plurality of second word lines being shorter than said first word line;

(3) a plurality of third word lines each extended in said first direction, said third word lines being arranged side by side, each of said plurality of third word lines being shorter than said first word line;

(4) a plurality of first memory cells connected to said plurality of second word lines;

(5) a plurality of second memory cells connected to said plurality of third word lines;

(6) a plurality of first selection lines each extended in said second direction, said first selection lines being arranged side by side;

(7) a plurality of second selection lines each extended in said second direction, said second selection lines being arranged side by side;

(8) a first selection circuit connected to said first word line, said plurality of first selection lines and said plurality of second word lines, and for selecting one of said plurality of second word lines in accordance with signals on said first word line and said plurality of first selection lines; and (9) a second selection circuit connected to said main word line, said plurality of second selection lines and said plurality of third word lines, and for selecting one of said plurality of third word lines in accordance with signals on said first word line and said plurality of second selection lines, wherein said first word line is formed in said first wiring layer, wherein said plurality of first selection lines and said plurality of second selection lines are formed in said second layer, wherein a not-selected level of each of said plurality of first selection lines is substantially equal to a not-selected level of said first word line, and wherein a not-selected level of each of said plurality of second selection lines is substantially equal to said not-selected level of said first word line.

18. A semiconductor memory device according to claim 17, wherein said plurality of first memory cells and said plurality of second memory cells are of a dynamic type.

19. A semiconductor memory device according to claim 17, wherein each of said first selection circuit and said second selection circuit has a decoding function.

20. A semiconductor memory device according to claim 17, wherein said not-selected level of each of said main word line, said plurality of first selection lines and said plurality of second selection lines is equal to a ground potential.

21. A semiconductor memory device according to claim 17, wherein said isolating layer is arranged on said first wiring layer, and wherein said second wiring layer is arranged on said isolating layer.

22. A semiconductor memory device according to claim 17, wherein each of said first wiring layer and said second wiring layer is a metal wiring layer.

* * * * *